(12) United States Patent
Seikh et al.

(10) Patent No.: US 8,451,652 B2
(45) Date of Patent: May 28, 2013

(54) WRITE ASSIST STATIC RANDOM ACCESS MEMORY CELL

(75) Inventors: Mohammed Rahim Chand Seikh, Bngalore (IN); Nikhil Lad, Bangalore (IN)

(73) Assignee: LSI Corporation, San Jose, CA (US)

( * ) Notice: Subject to any disclaimer, the term of this patent is extended or adjusted under 35 U.S.C. 154(b) by 258 days.

(21) Appl. No.: 12/958,402

(22) Filed: Dec. 2, 2010

(65) Prior Publication Data

US 2012/0140552 A1 Jun. 7, 2012

(51) Int. Cl.
*G11C 11/00* (2006.01)

(52) U.S. Cl.
USPC .................................. 365/154; 365/189.16

(58) Field of Classification Search
USPC .............................................. 365/154, 189.16
See application file for complete search history.

(56) References Cited

U.S. PATENT DOCUMENTS

| | | | | |
|---|---|---|---|---|
| 2004/0004298 A1* | 1/2004 | Madurawe | | 257/903 |
| 2005/0099872 A1* | 5/2005 | Morgan | | 365/222 |
| 2007/0159873 A1* | 7/2007 | Boemler | | 365/154 |
| 2009/0116279 A1* | 5/2009 | Maeda et al. | | 365/154 |
| 2010/0097844 A1 | 4/2010 | Liu | | |

OTHER PUBLICATIONS

Pilo H; Barwin J; Braceras G; Burns S; Gabric J; Lamphire S; Miller M; Roberts A; Towler F, An SRAM design in 65nm and 45nm technology nodes featuring read and write-assist circuits to expand operating voltage, VLSI Circuits, Digest of Technical Papers, Year 2006.

* cited by examiner

*Primary Examiner* — Hoai V Ho
(74) *Attorney, Agent, or Firm* — Mendelsohn, Drucker & Associates, P.C.; Steve Mendelsohn

(57) ABSTRACT

Static random access memory (SRAM) cells are disclosed. In one example embodiment the SRAM cell includes a latch having a first node and a second node for storing bit information at the first node and a complement of the bit at the second node. The SRAM cell further includes a first switch controlled by a write operation signal, connected between a supply voltage and a first pull-up transistor of the latch and a third switch controlled the write operation signal, connected between the second node and a ground voltage. The SRAM cell further includes a second switch controlled by the write operation signal, connected between the supply voltage and a second pull-up transistor and a fourth switch controlled by the write operation signal, connected between the second node and the ground voltage. The write operation signals are generated by a first complex gate and a second complex gate.

19 Claims, 6 Drawing Sheets

WRITE ASSIST STATIC RANDOM ACCESS MEMORY CELL

TECHNICAL FIELD

The disclosure relates generally to electronic circuits, and more particularly to static random access memory (SRAM).

BACKGROUND

Static random access memory (SRAM) is commonly used in integrated circuits. SRAM cells have the advantageous feature of holding data without requiring refreshing. The SRAM cells include different numbers of transistors, and are often identified by the number of transistors in the SRAM cell. For example, six-transistor (6-T) SRAM cell, eight-transistor (8-T) SRAM cell, and so on. Typically, the transistors in the SRAM cell form a data latch for storing a bit. The SRAM cells are typically arranged as an array having rows and columns. Each row of the SRAM cell array is connected to a word line, which determines whether a current SRAM cell is selected or not. Each column of the SRAM cell array is connected to a bit line (or a pair of bit-lines), which is used for storing a bit into, or reading a bit from, the SRAM cell.

With an increase in down-scaling of the integrated circuits, operating voltages of the integrated circuits, along with the operation voltages of memory circuits are also being reduced. Accordingly, read and write margins of the SRAM cells, which measure how reliably the bits of the SRAM cells can be read from and written into, are also reduced. Due to the existence of static noise, the reduced read and write margins may cause errors in the respective read and write operations.

SUMMARY OF THE DISCLOSURE

In accordance with one aspect of the present disclosure, a static random access memory (SRAM) cell includes a latch having a first node and a second node for storing bit information at the first node and a complement of the bit information at the second node. The SRAM cell further includes a first switch controlled by a write operation signal, connected between a supply voltage and a first pull-up transistor of the latch, the first switch being deactivated during a write operation. The SRAM cell further includes a third switch controlled by the write operation signal, connected between the second node and a ground voltage, the third switch being activated during the write operation. The SRAM cell further includes a second switch controlled by the write operation signal, connected between the supply voltage and a second pull-up transistor. The second switch is activated during the write operation. The SRAM cell further includes a fourth switch controlled by the write operation signal, connected between the second node and the ground voltage, the fourth switch being deactivated during the write operation.

In accordance with another aspect of the present disclosure, the SRAM cell further includes a first complex gate connected to one or more word lines and one or more bit lines and a second complex gate connected to the one or more word lines and one or more complementary bit lines.

BRIEF DESCRIPTION OF THE DRAWINGS

Various embodiments are described herein with reference to the drawings, wherein.

The drawings described herein are for illustration purposes only and are not intended to limit the scope of the present disclosure in any way.

DETAILED DESCRIPTION

A static random access memory (SRAM) cell with write assist is disclosed. In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following detailed description is, therefore, not to be taken in a limiting sense, and the scope of the present disclosure is defined by the appended claims.

Figure 1:
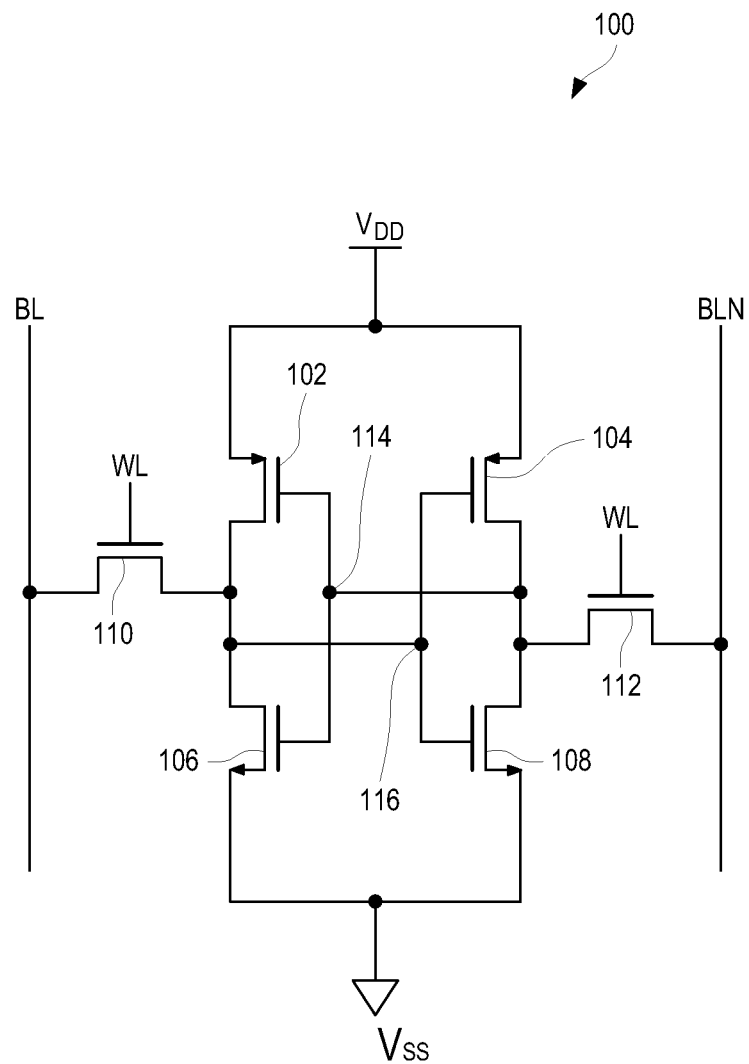
FIG. 1 illustrates a static random access memory (SRAM) cell with one word line and one bit line, in context of the present disclosure.

FIG. 1 illustrates a SRAM cell 100 with one word line (WL) and one bit line (BL), in context of the present disclosure. The SRAM cell 100 is a type of memory device that stores data in an array of cells that do not need to be constantly refreshed as long as it remains being supplied with power. FIG. 1 schematically illustrates a conventional 6-T SRAM cell 100 consisting of pull-up transistors 102 and 104, pull-down transistors 106 and 108, and pass gate transistors 110 and 112. The pull-up transistor 102 is a PMOS transistor having a source coupled to a supply voltage ($V_{DD}$) and a drain coupled to a drain of the pull-down transistor 106. The pull-down transistor 106 is an NMOS transistor having its source coupled to ground voltage ($V_{SS}$). The ground voltage ($V_{SS}$) is a voltage lower than the supply voltage ($V_{DD}$). The pull-up transistor 104 is also a PMOS transistor having a source coupled to the supply voltage ($V_{DD}$) and a drain coupled to a drain of the pull-down transistor 108. The pull-down transistor 108 is an NMOS transistor having its source coupled to the source of the pull-down transistor 106 and to the ground voltage $V_{SS}$. The gates of the pull-up transistor 102 and the pull-down transistor 106 are coupled together and to the drains of the pull-up transistor 104 and the pull-down transistor 108 at a first node 114. Likewise, the gates of the pull-up transistor 104 and the pull-down transistor 108 are coupled together and to the drains of the pull-up transistor 102 and the pull-down transistor 106 at a second node 116. The pass gate transistor 110 connects the second node 116 to a bit line (BL), whereas the pass gate transistor 112 connects the first node 114 to a complementary bit line (BLN).

The pull-up transistor 102 and the pull-down transistor 106 make up an inverter cross-coupled with another inverter including the pull-up transistor 104 and the pull-down transistor 108. When the pass gate transistors 110 and 112 are turned off, the first and second nodes 114 and 116 latch a value and its complement therein. In a read or write operation, the signal on the word line (WL) is asserted to turn on the pass gate transistors 110 and 112 to enable the first and second nodes 114 and 116 to be accessed through the bit line (BL) and the complementary bit line (BLN).

In the SRAM cell 100, the data stored in the array of cells are disturbed during the read or write operation. In a physical SRAM chip, a plurality of SRAM cells 100 are arranged in an array where a row of the SRAM cells 100 are connected by a single word line (WL). During the read or write operation, the signal on a word line (WL) is asserted to turn on the pass gate transistors of a row of the SRAM cells 100. Although only one SRAM cell 100 on a selected row and selected column is desired for the read or write operation, pass gate transistors of other SRAM cells 100 on the selected row are also turned on, thereby causing data stored in those cells to be in direct connection with their corresponding bit lines (BLs) and complementary bit lines (BLNs). As a result, the data stored in those cells are disturbed by the voltages on the bit lines (BLs) and the complementary bit lines (BLNs).

Figure 2:
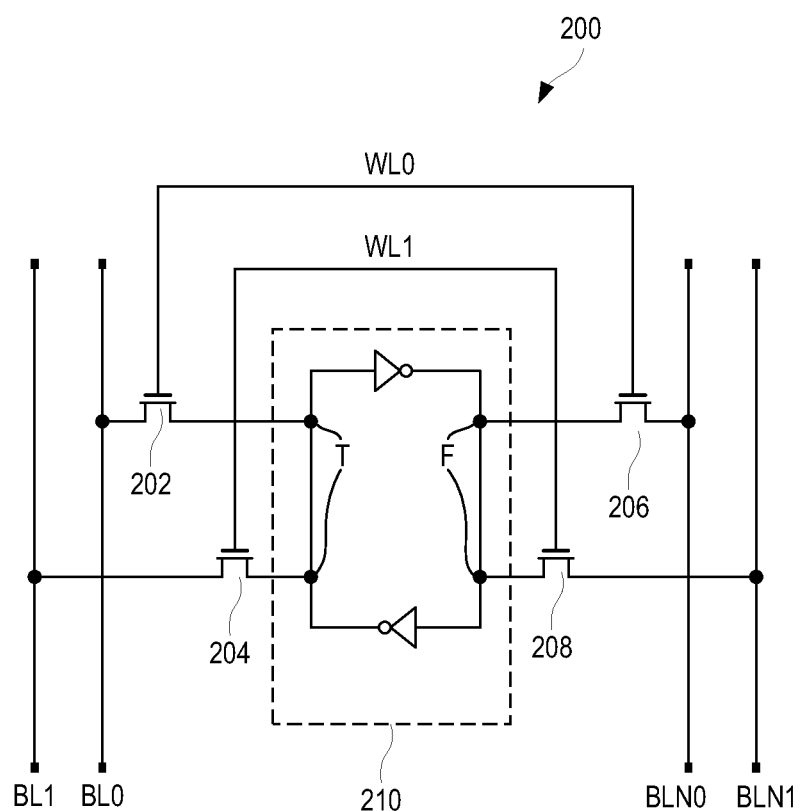
FIG. 2 illustrates a SRAM cell with two word lines and two bit lines, in context of the present disclosure.

FIG. 2 illustrates a SRAM cell 200 with two word lines (WL0, WL1) and two bit lines (BL0, BL1), in context of the present disclosure. The SRAM cell 200 is operated with two word lines (WL0 and WL1), two bit lines (BL0 and BL1) and two complementary bit lines (BLN0 and BLN1). The word line (WL0) and the bit line (BL0) are connected to the SRAM cell 200 at a node T by a pass gate transistor 202. The word line (WL1) and the bit line (BL1) are connected to the SRAM cell 200 at the node T by a pass gate transistor 204. The word line (WL0) and the complementary bit line (BLN0) are connected to the SRAM cell 200 at node F by a pass gate transistor 206. The word line (WL1) and the complementary bit line (BLN1) are connected to the SRAM cell 200 at the node F by a pass gate transistor 208. The pass gate transistors 202 and 206 and pass gate transistors 204 and 208 are transistor switches whose conductive states are controlled by the word lines WL0 and WL1, respectively. The node T and the node F are complementary to each other.

In a write operation, one word line facilitates writing to the SRAM cell 200 and the other word line remains in a dummy read mode, so that both the pass gate transistors 202 and 204 can remain in ON state. In addition, before the write operation starts, both the bit lines (BL0, BL1) are pre-charged to logic HIGH. For example, if a write operation is executing through the pass gate transistor 202, the other pass gate transistor 206 the conductive state (typically on or off) of which is controlled by the same word line, WL0, which also controls pass gate transistor 202, also remains in ON state. Typically, during a write operation, the pass gate transistor 202 opposes the operation of a pull-up transistor in the SRAM cell 200 (i.e., which is in ON state) and the operation of the other pass gate transistor 204 as the bit lines (BL0 and BL1) are pre-charged to logic HIGH.

Figure 3:
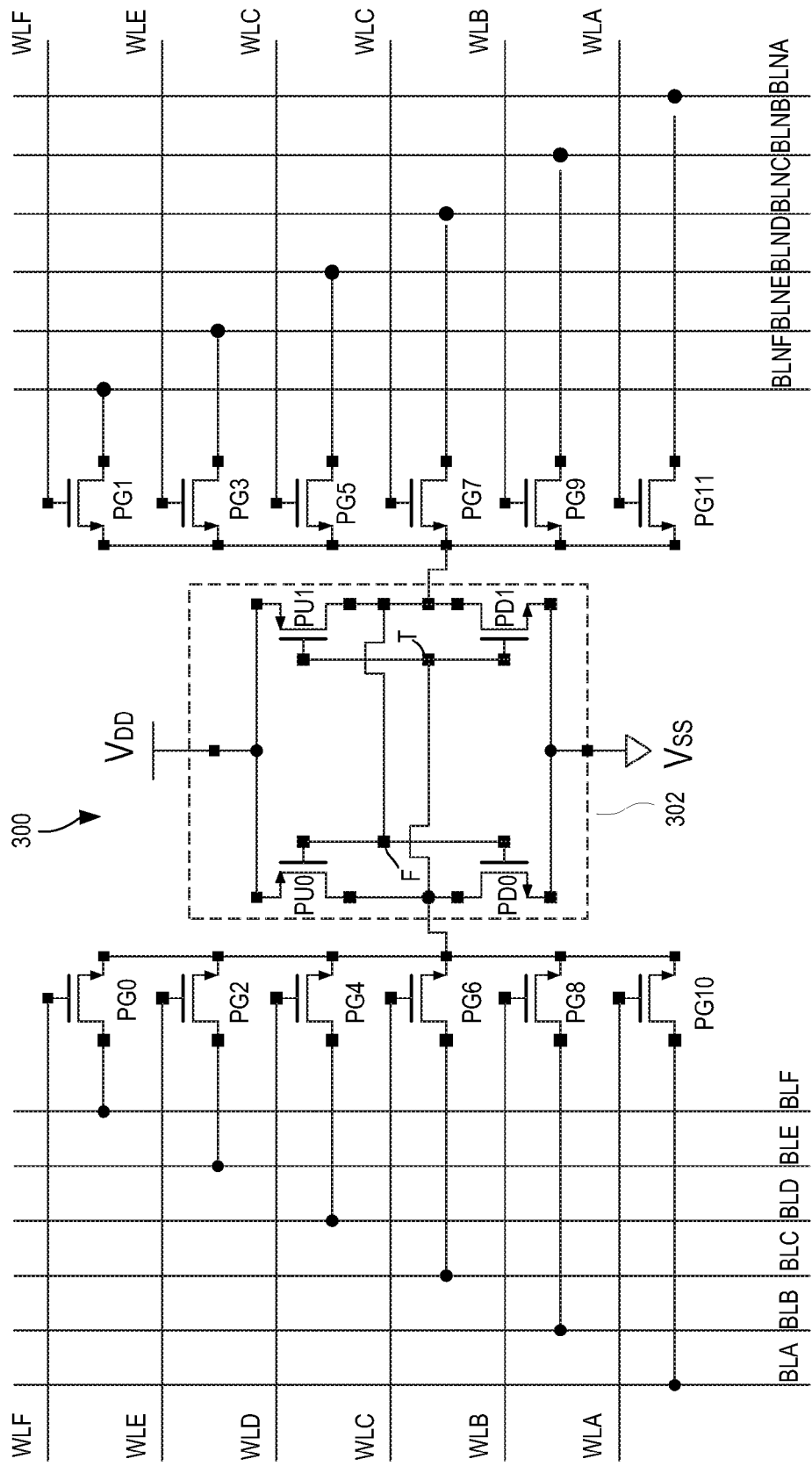
FIG. 3 illustrates a multi-port SRAM cell with three write ports and three read ports, in context of the present disclosure.

FIG. 3 illustrates a multi-port SRAM cell 300 with three write ports and three read ports, in context of the present disclosure. The read ports and the write ports are also represented by the word lines (WL). The multi-port SRAM cell 300 includes a latch 302. The latch 302 includes a first pull-up transistor (PU0), a second pull-up transistor (PU1), a first pull-down transistor (PD0) and a second pull-down transistor (PD1). The first pull-up transistor (PU0) is a PMOS transistor having a source coupled to a supply voltage ($V_{DD}$), and a drain coupled to a drain of the first pull-down transistor (PD0). The first pull-down transistor (PD0) is an NMOS transistor having its source coupled to ground voltage ($V_{SS}$). The second pull-up transistor (PU1) is also a PMOS transistor having a source coupled to the supply voltage ($V_{DD}$), and a drain coupled to a drain of the second pull-down transistor (PD1). The second pull-down transistor (PD1) is an NMOS transistor having its source coupled to the source of the first pull-down transistor (PD0), and to the ground voltage (Vss). The gates of first the pull-up transistor (PU0) and the first pull-down transistor (PD0) are coupled together and to the drains of the second pull-up transistor (PU1) and the second pull-down transistor (PD1) at a first node F. Likewise, the gates of the second pull-up transistor (PU1) and the second pull-down transistor (PD1) are coupled together with the drains of the first pull-up transistor (PU0) and the first pull-down transistor (PD0) at a second node T. The first node F and the second node T are used for storing a bit and a complementary bit.

The multi-port SRAM cell 300 includes six word lines (WLA, WLB, WLC, WLD, WLE, WLF). The word lines (WLA, WLB, WLC) are represented as three write ports A, B and C, respectively. The word lines (WLD, WLE, WLF) are represented as three read ports D, E and F, respectively. The multi-port SRAM cell 300 further includes a plurality of bit lines (BLA, BLB, BLC, BLD, BLE, BLF). The multi-port SRAM cell 300 further includes a plurality of complementary bit lines (BLNA, BLNB, BLNC, BLND, BLNE, BLNF). The plurality of bit lines (BLA, BLB, BLC, BLD, BLE, BLF), the plurality of corresponding complementary bit lines (BLNA, BLNB, BLNC, BLND, BLNE, BLNF) and word lines (WLA, WLB, WLC, WLD, WLE, WLF) are connected to the latch 302 through pass gate transistors (PG0, PG1, PG2, PG3, PG4, PG5, PG6, PG7, PG8, PG9, PG10, PG11). In the illustrated embodiment, the pass gate transistors connect the read ports, the write ports, the bit lines and the complementary bit lines to a first node F and a second node T of the multi-port SRAM cell 300 as is known in the art. The first node F and second node T are used for storing a bit and a complementary bit, respectively. The pass gate transistors (PG0, PG1, PG2, PG3, PG4, PG5, PG6, PG7, PG8, PG9, PG10, PG11) are NMOS transistors. In a write operation, one write port writes to the multi-port SRAM cell 300 and all other ports remains in a dummy read mode so that all other pass gate transistors can remain in ON state. In addition, before the write operation starts, all write lines and all bit lines are pre-charged to logic HIGH.

For example, if a write operation is executing through a pass gate transistor (PG10), the other pass gate transistors (PG8, PG6, PG4, PG2, PG0) can also remain in ON state. Typically, during the write operation, the pass gate transistor (PG10) opposes the operation of the first pull-up transistor (PU0) (i.e., which remains in ON state) and also opposes the operation of all other pass gate transistors (PG8, PG6, PG4, PG2 and PG0) as the bit lines are pre-charged to logic HIGH.

For the write operation to execute properly, a current (Ion) in the pass gate transistor (PG10) should be more than the sum of current supplied by the first pull-up transistor (PU0) and all the pass gate transistors (PG8, PG6, PG4, PG2, PG0) supplied to an internal node of the multi-port SRAM cell 300. The internal nodes include the first node F and the second node T in the multi-port SRAM cell 300. This requires a size of the pass gate transistor (PG10) to be large. In other words, the size of the pass gate transistor (PG10) should be large enough to maintain a write margin (WM) (not to be less than 20% in a worst case scenario). Similarly the sizes of all other pass gate transistors need to be increased. Once the size of the pass gate transistors are increased, current contribution to the internal nodes due the pass gate transistors also increases. The increase in the current contribution to the internal nodes renders changing the state of the bit stored in latch 302 of the multi-port SRAM cell 300 difficult. Also to maintain a cell access ratio, the size of the pull-down transistors (PD0, PD1)

needs to be increased with the increase in the size of the pass gate transistors. With the increase in the size of the pull-down transistors (PD0, PD1), the ratio between the pull-up transistors (PU0, PU1) and the pull-down transistors (PD0, PD1) becomes too weak, resulting in shifting of a trip point of the multi-port SRAM cell 300 from $V_{DD}/2$. The shifting of the trip point makes the multi-port SRAM cell 300 unstable. Moreover, a leakage current in the multi-port SRAM cell 300 increases with the increase in the size of the pass gate transistors (PG10). Also, area of the multi-port SRAM cell 300 increases with the increase in the size of the pass gate transistors (PG10).

Typically, the strength of a pull-up transistor strength should be weak the strength of, a pull-down transistor should be strong and the strength of a pass gate transistor should be between the strength of the pull-up transistor the strength of and the pull-down transistor. Thus, with the increase in the size of the pass gate transistor (PG10), the first pull-down transistor (PD0) size needs to be increased. Typically, in the multi-port SRAM cell 300, the cell access ratio should be high to maintain read margin (RM). The cell access ratio is a ratio of the size of the first pull-down transistor (PD0) size to the pass gate transistor (PG10) size. The high cell access ratio can be achieved by increasing the size of the the first pull-down transistor (PD0). Hence, to maintain the RM, the size of the first pull-down transistor (PD0) needs to be increased.

Further, if the size of the first pull-down transistor (PD0) is increased, the size of the first pull-down transistor (PD0) compared to the size of the first pull-up transistor (PU0) becomes too large. As a result, a ratio of pull-down transistor to the strength of the pull-up transistor becomes too high. This causes instability in the multi-port SRAM cell 300 and hence maintaining a signal to noise margin (SNM) within the desired range for which the circuit was designed becomes difficult. For example, in the latch 302, the trip point of the inverter (consisting of the PD0 and PU0) may fail to stay at the middle point of the supply voltage ($V_{DD}$) which causes instability in the multi-port SRAM cell 300. This may further adds to the instability that already exists in the multi-port SRAM cell 300 due to the transistor variation.

Further, after a write operation, restoration of the internal nodes becomes poor which degrades performance of the multi-port SRAM cell 300. Typically, the performance of the multi-port SRAM cell 300 is improved by increasing the size of the first pull-up transistor (PU0). However, if the size of the first pull-up transistor (PU0) is increased, the size of the first pull-down transistor (PD0) and the size of the pass gate transistors (PG0, PG2, PG4, PG6, PG8, PG10) also needs to be increased which is generally not desirable as the area of the multi-port SRAM cell 300 increases.

Figure 4:
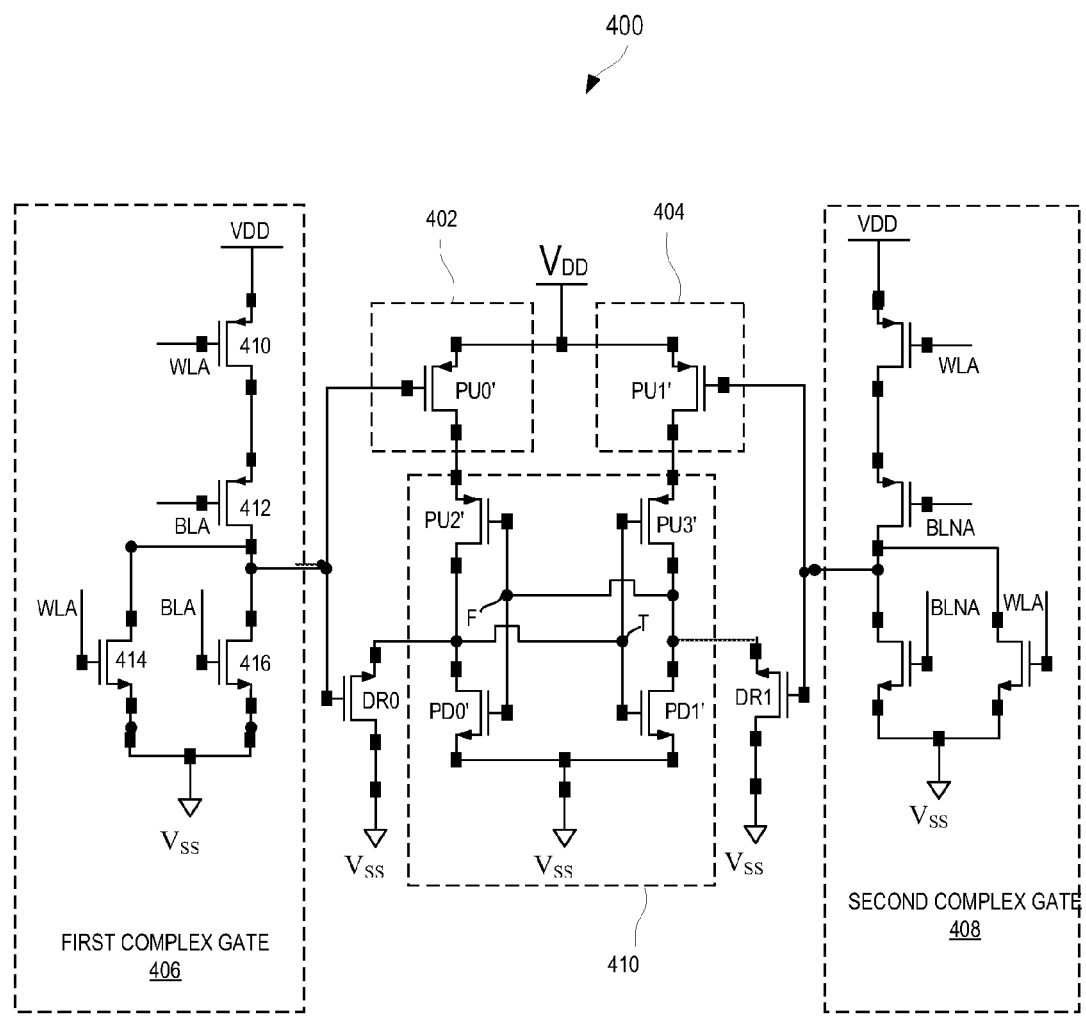
FIG. 4 illustrates a circuit diagram of a multi-port SRAM cell with write assist with one word line and one bit line, according to one embodiment.

FIG. 4 illustrates a circuit diagram of a multi-port SRAM cell 400 with write assist with one word line (WLA) and one bit line (BLA), according to one embodiment. The multi-port SRAM cell 400 includes a latch 410. The latch 410 includes a first pull-up transistor (PU2'), a second pull-up transistor (PU3'), a first pull-down transistor (PD0') and second pull-down transistor (PD1'). The first pull-up transistor (PU2') is a PMOS transistor having a source coupled to a first switch 402 (PU0'), and a drain coupled to a drain of the first pull-down transistor (PD0'). The first pull-down transistor (PD0') is an NMOS transistor having its source coupled to ground voltage (Vss). The second pull-up transistor (PU3') is also a PMOS transistor having a source coupled to a second switch 404 (PU1'), and a drain coupled to a drain of the second pull-down transistor (PD1'). The second pull-down transistor (PD1') is an NMOS transistor having its source coupled to the source of the first pull-down transistor (PD0'), and to ground voltage (Vss). The gates of the first pull-up transistor (PU2') and the first pull-down transistor (PD0') are coupled together and also coupled to the drains of the second pull-up transistor (PU3') and second pull-down transistor (PD1') at a first node F. Likewise, the gates of the second pull-up transistor (PU3') and the second pull-down transistor (PD1') are coupled together with the drains of the first pull-up transistor (PU2') and the first pull-down transistor (PD0') at a second node T. The first node F and the second node T are used for storing a bit and a complementary bit.

The first switch 402 (PU0') is connected between a supply voltage ($V_{DD}$) and the first pull-up transistor (PU2'). The second switch 404 (PU1') is connected between the supply voltage ($V_{DD}$) and the second pull-up transistor (PU3'). The first switch 402 and the second switch 404 are PMOS transistors. The multi-port SRAM cell 400 further includes a third switch (DR0) connected between a second node T and the ground voltage (Vss). The multi-port SRAM cell 400 further includes a fourth switch (DR1) connected between the first node F and the ground voltage (Vss). The third switch (DR0) and the fourth switch (DR1) are also represented as write drivers in the present disclosure. The multi-port SRAM cell 400 also includes a first complex gate 406 and a second complex gate 408. Inputs of the first complex gate 406 are connected to the word line (WLA) and a bit line (BLA). Further the inputs of the second complex gate 408 are connected to the word line (WLA) and a complimentary bit line (BLNA). The output of the first complex gate 406 is connected to the gates of the first switch 402 and the third switch (DR0). The output of the second complex gate 408 is connected to the gates of the second switch 404 and the fourth switch (DR1). In one exemplary embodiment, the first complex gate 406 and the second complex gate 408 are NOR gates. The output of the first complex gate 406 controls the first switch 402 and the third switch (DR0). The output of the second complex gate 408 controls the second switch 404 and the fourth switch (DR1).

As shown in FIG. 4, the first complex gate 406 includes two PMOS transistors 418, 412 and two NMOS transistors 414, 416. The two PMOS transistors 418, 412 are connected in series. The source of the first PMOS transistor 418 is connected to the supply voltage (VDD). The drain of the first PMOS transistor 418 is connected to the source of the second PMOS transistor 412. The NMOS transistors are 414, 416 connected in parallel. The source of the both the NMOS transistors 414, 416 are coupled together. Similarly the drains of both of the NMOS transistors 414, 416 are coupled together. The drains of both the NMOS transistors 414, 416 are connected to the ground voltage (Vss). The drain of the second PMOS transistor 412 is coupled to the sources of the NMOS transistors 414, 416. The gate of the first PMOS transistor 418 is connected to the word line (WLA). The gate of the second PMOS transistor 412 is connected to the bit line (BLA). The gate of first NMOS transistor 414 also is connected to the word line (WLA). The gate of second NMOS transistor 416 is connected to the bit line (BLA). Further as shown in FIG. 4, the structure of the second complex gate 408 is same as the structure of the first complex gate 406. The structure of the first complex gate 406 is repeated for every additional word line (WL). A structure of a first complex gate 406 and a second complex gate 408 for a SRAM cell with 3 word lines is shown with respect to FIG. 5. During a write operation in multi-port SRAM cell 400, output of the one of the complex gates is kept at logic HIGH. The one of the first switch 402 and the second switch 404 is used to switch off one of the pull-up transistors PU2', PU3' during the write operation. The first complex gate 406 and the second complex gate 408 isolates the multi-port SRAM cell 400 from the word lines (WLA) and the bit lines (BLA).

Figure 5:
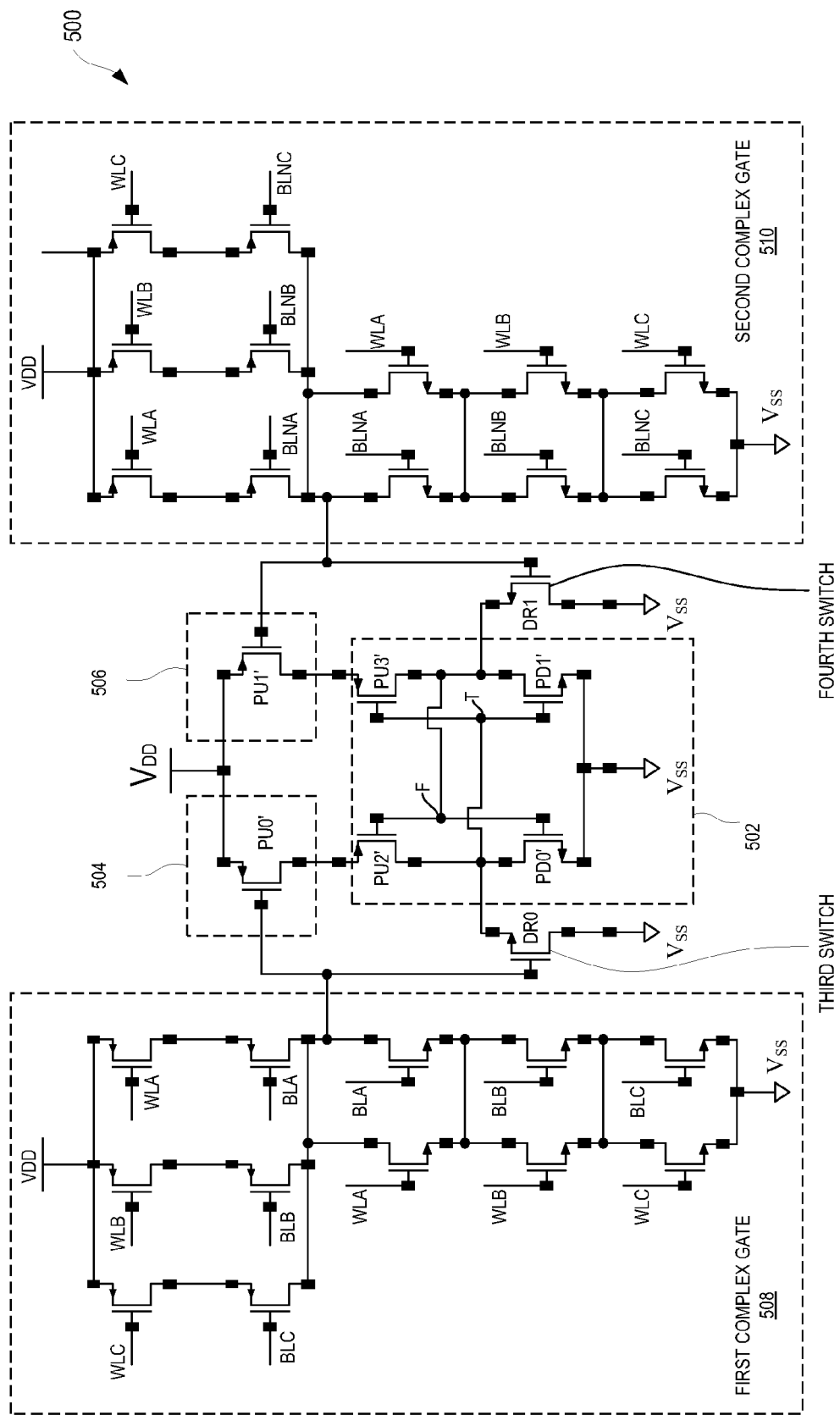
FIG. 5 illustrates another circuit diagram of a multi-port SRAM bit cell with write assist, according to one embodiment.

FIG. 5 illustrates another circuit diagram of a multi-port SRAM cell 500 with write assist, according to one embodiment. The multi-port SRAM cell 500 includes three word lines (WLA, WLB, WLC). Although only three word lines (WLA, WLB, WLC) are shown in FIG. 5, any number of word lines (WLs) can be connected to the multi-port SRAM cell 500. The multi-port SRAM cell 500 further includes a latch 502. The latch 502 includes a first pull-up transistor (PU2'), a second pull-up transistor (PU3'), a first pull-down transistor (PD0') and a second pull-down transistor (PD1'). The first pull-up transistor (PU2') is a PMOS transistor having a source coupled to a first switch 504 (PU0'), and a drain coupled to a drain of the first pull-down transistor (PD0'). The first pull-down transistor (PD0') is an NMOS transistor having its source coupled to ground voltage ($V_{SS}$). The second pull-up transistor (PU3') is also a PMOS transistor having a source coupled to a second switch 506 (PU1'), and a drain coupled to a drain of the second pull-down transistor (PD1'). The second pull-down transistor (PD1') is an NMOS transistor having its source coupled to the source of the first pull-down transistor (PD0'), and to the ground voltage (Vss). The gates of the first pull-up transistor (PU2') and the first pull-down transistor (PD0') are coupled together with the drains of the second pull-up transistor (PU3') and the second pull-down transistor (PD1') at a first node F. Likewise, the gates of the second pull-up transistor (PU3') and the second pull-down transistor (PD1') are coupled together with the drains of the first pull-up transistor (PU2') and the first pull-down transistor (PD0') at a second node T. The first node F and the second node T are used for storing a bit and a complementary bit.

The first switch 504 is connected between the voltage supply ($V_{DD}$) and the first pull-up transistor (PU2'). The first switch 504 is used to cut the supply voltage ($V_{DD}$) to the first pull-up transistor (PU2') during a write operation. The second switch 506 is connected between the supply voltage ($V_{DD}$) and the second pull-up transistor (PU3'). The second switch 506 is used to cut the supply voltage ($V_{DD}$) to the second pull-up transistor (PU3') during the write operation. Further, as shown in FIG. 5, the multi-port SRAM cell 500 includes a third switch (DR0) and a fourth switch (DR1). The third switch (DR0) and the fourth switch (DR1) are also represented as a write driver (DR0) and a write driver (DR1), respectively. The third switch (DR0) is connected between the second node T and the ground voltage (Vss). The fourth switch (DR1) is connected between the first node F and the ground voltage (Vss). The third switch (DR0) and the fourth switch (DR1) are used for writing data (e.g., logical values 0 and 1) to the first node F and the second node T respectively, of the latch 502.

Also, as shown in FIG. 5, the multi-port SRAM cell 500 includes a first complex gate 508 and a second complex gate 510. The first complex gate 508 and the second complex gate 510 are used for generating and forwarding a gate signal to the third switch (DR0) and the fourth switch (DR1), respectively, for writing the data to the multi-port SRAM cell 500. Input of the first complex gate 508 is a combination of word lines (WLA, WLB, WLC) and bit lines (BLA, BLB, BLC). Input of the second complex gate 510 is a combination of word lines (WLA, WLB, WLC) and complementary bit lines (BLNA, BLNB, BLNC). An output of the first complex gate 508 is connected to a gate of the first switch 504 and a gate of the third switch (DR0). An output of the second complex gate 510 is connected to a gate of the second switch 506 and a gate of the fourth switch (DR1). The output of the first complex gate 508 is used to control the first switch 504 and the third switch (DR0). The output of the second complex gate 510 is used to control the second switch 506 and the fourth switch (DR1). At the start of the write operation, the word lines (WLA, WLB, WLC) and the bit lines (BLA, BLB, BLC) are inverted, (by default the word lines and bit lines remain at logic HIGH). When the write operation is initiated, one of the write port word lines (WLA, WLB, WLC) and one of the bit lines (BLA, BLB, BLC) goes LOW and the output of the one of the first and the second complex gates 508, 510 goes HIGH. Furthermore, when logic 0 is to be written to the multi-port SRAM cell 500, the bit line goes LOW and the output of the first complex gate 508 goes HIGH. The HIGH output of the first complex gate 508 switches ON the third switch (DR0) and switches OFF the first switch 504. When a logical value 1 is to be written, the complementary bit line goes LOW and the output of the second complex gate 510 goes HIGH.

In one embodiment, when the third switch (DR0) writes the logical value 0 to the multi-port SRAM cell 500, the first switch 504 is turned OFF to cut off the supply voltage (VDD) to an internal node of the multi-port SRAM cell 500. In another embodiment, when the fourth switch (DR1) writes the logical value 1 to the multi-port SRAM bit cell 500, the second switch 506 is turned OFF to cut off the supply voltage (VDD) to the internal node of the multi-port SRAM cell 500. This prevents the third switch (DR0) and the fourth switch (DR1) from opposing operation of the corresponding pull-up transistors (PU2, PU3), respectively.

For example, if the write is happening through the third switch (DR0), then the output of the first complex gate 508 becomes logic HIGH and the third switch (DR0) is turned ON. The third switch (DR0) writes the logical value 0 to the multi-port SRAM cell 500. Further, while writing the data to the latch 502, the first switch 504 is turned OFF to prevent the conflict between the third switch (DR0) and the first pull-up transistor (PU2'). Thus, by preventing the conflict between the third switch (DR0) and the first pull-up transistor (PU2'), approximately about 100% write margin at all possible corners can be achieved. The proposed scheme also helps to achieve 22% SNM at 0.72 v, FS, 125 c with 6-sigma variation. The operation of the latch 502 will break when the first switch 504 is turned OFF.

Also, in the proposed scheme, sizes of the pull-up transistors (PU2', PU3'), the first switch 504 and the second switch 506 are changed to improve restoration and thus to enhance the performance of the multi-port SRAM cell 500. Further, one skilled in the art may appreciate that, large sizes of the pull-up transistor does not deteriorate the stability of the multi-port SRAM cell 500 but rather helps improve the stability of the multi-port SRAM cell 500 as the trip point of the latch 502 stays very close to the midpoint of the supply voltage (VDD/2).

Furthermore, in the multi-port SRAM bit cell 500, the complex gate structures are changed to accommodate more or less number of word lines and read lines without affecting the performance and the stability of the multi-port SRAM cell 500. The latch 502 remains the same even when the word lines and read lines are added and/or removed from the multi-port SRAM cell 500. Moreover, the multi-port SRAM cell 500 enables sharing of all the three pull-up transistors in the complex gate (where word lines are connected) between the first complex gate 508 and the second complex gate 510 which helps reduce gate count.

Figure 6:
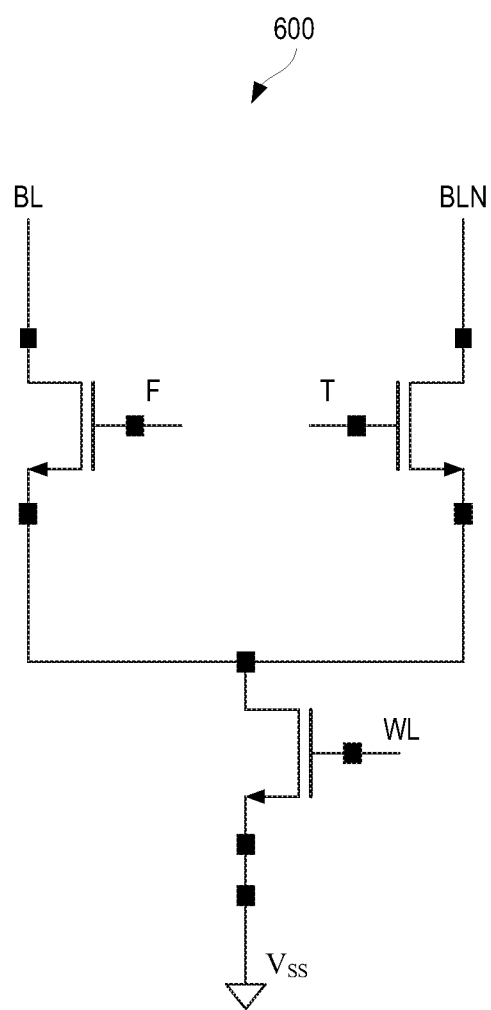
FIG. 6 illustrates a read port structure of the multi-port SRAM cell of FIG. 4 and FIG. 5, according to one embodiment.

FIG. 6 illustrates a read port structure 600 of the multi-port SRAM cell 400 shown in FIG. 4 and the multi-port SRAM cell 500 shown in FIG. 5, according to one embodiment. The read structures for the proposed multi-port SRAM cell 400, 500, include internal storage nodes (T and F) are connected to the gate of the read port pass gate transistors. This structure does not deteriorate the stability of the multi-port SRAM cell 400, 500. The sizes of the transistors are optimized based on performance requirement and power specification. Many such structures can be added to the FIG. 4 and FIG. 5, and increase the number of read ports in the design without any stability issue. All the transistors shown in the FIG. 4 and FIG. 5 can be as minimum in size as the technology can support, however, the stability of the multi-port SRAM cell 400, 500 does not degrade.

The proposed design can be used for the N-port compiler design as the multi-port SRAM cell stability and reliability does not degrade with any combination of word lines ports and read lines. Further, the proposed design can be fabricated in an integrated circuit and used in embedded memory in an integrated circuit including but not limited to processors, network switching fabrics, application specific integrated circuits and programmable logic devices, or can also be used in external integrated circuit memory.

Although the present embodiments have been described with reference to specific example embodiments, it will be evident that various modifications and changes may be made to these embodiments without departing from the broader spirit and scope of the various embodiments. Furthermore, the various devices, modules, analyzers, generators, and the like described herein may be enabled and operated using hardware circuitry, for example, complementary metal oxide semiconductor based logic circuitry, firmware, software and/ or any combination of hardware, firmware, and/or software embodied in a machine readable medium. For example, the various electrical structure and methods may be embodied using transistors, logic gates, and electrical circuits, such as application specific integrated circuit.

The invention claimed is:

1. A static random access memory (SRAM) cell, comprising:
   a latch having a first node and a second node for storing a bit information at the first node and a complement of the bit information at the second node;
   a first switch controlled by a first write operation signal, connected between a supply voltage and a first pull-up transistor of the latch;
   a second switch controlled by a second write operation signal, connected between the supply voltage and a second pull-up transistor of the latch;
   a third switch controlled by the first write operation signal, connected between the first node and ground voltage; and
   a fourth switch controlled by the second write operation signal, connected between the second node and the ground voltage, wherein:
      during a write operation in which a logical value 1 is stored in the latch, (i) the first and fourth switches are activated and (ii) the second and third switches are deactivated; and
      during a write operation in which a logical value 0 is stored in the latch, (i) the first and fourth switches are deactivated and (ii) the second and third switches are activated.

2. The SRAM cell of claim 1, wherein the first write operation signal is logic HIGH to store the logical value 0 in the latch.

3. The SRAM cell of claim 1, wherein:
   the first switch and the second switch are PMOS transistors; and
   the third switch and the fourth switch are NMOS transistors.

4. The SRAM cell of claim 1, wherein:
   the first write operation signal is an output of a combination of one or more bit lines and one or more word lines; and
   the second write operation signal is an output of a combination of one or more complementary bit lines and the one or more word lines.

5. The SRAM cell of claim 4, wherein the one or more word lines remain at logic LOW and the one or more bit lines remain at logic HIGH to store the logical value 1 in the latch.

6. A static random access memory (SRAM) cell, comprising:
   a latch having a first node and a second node for storing bit information at the first node and a complement of the bit information at the second node;
   a first complex gate connected to one or more word lines and one or more bit lines;
   a second complex gate connected to the one or more word lines and one or more complementary bit lines;
   a first switch, controlled by an output of the first complex gate, connected between a supply voltage and a first pull-up transistor of the latch;
   a second switch, controlled by an output of the second complex gate, connected between the supply voltage and a second pull-up transistor of the latch;
   a third switch, controlled by the output of the first complex gate, connected between the first node and a ground voltage; and
   a fourth switch, controlled by the output of the second complex gate, connected between the second node and the ground voltage, wherein:
      during a write operation in which a logical value 1 is stored in the latch, (i) the first and fourth switches are activated and (ii) the second and third switches are deactivated; and
      during a write operation in which a logical value 0 is stored in the latch, (i) the first and fourth switches are deactivated and (ii) the second and third switches are activated.

7. The SRAM cell of claim 6, wherein:
   the first switch and the second switch are PMOS transistors; and
   the third switch and the fourth switch are NMOS transistors.

8. The SRAM cell of claim 6, wherein the first complex gate and the second complex gate are NOR logic gates.

9. The SRAM cell of claim 6, wherein the one or more word lines remain at logic LOW and the one or more bit lines remain at logic HIGH to store the logical value 1 in the latch.

10. The SRAM cell of claim 6, wherein the output of the first complex gate is logic HIGH during the write operation of the logical value 0 into the latch.

11. A static random access memory (SRAM) cell, comprising:
    a latch having a first node and a second node for storing bit information at the first node and a complement of the bit information at the second node;
    a word line;
    a bit line and a complementary bit line;
    a first NOR gate connected to the word line and the bit line;
    a second NOR gate connected to the word line and the complementary bit line;
    a first switch, controlled by an output of the first NOR gate, connected between a supply voltage and a first pull-up transistor of the latch;
    a second switch, controlled by an output of the second NOR gate, connected between the supply voltage and a second pull-up transistor of the latch;

a third switch controlled by the output of the first NOR gate, connected between the first node and a ground voltage; and a fourth switch controlled by the output of the second NOR gate, connected between the second node and the ground voltage, wherein:

during a write operation in which a logical value 1 is stored in the latch, (i) the first and fourth switches are activated and (ii) the second and third switches are deactivated; and during a write operation in which a logical value 0 is stored in the latch, (i) the first and fourth switches are deactivated and (ii) the second and third switches are activated.

12. The SRAM cell of claim 11, wherein:
the first switch and the second switch are PMOS transistors; and
the third switch and the fourth switch are NMOS transistors.

13. The SRAM cell of claim 11, wherein the third switch and the fourth switch are write drivers for writing the bit information at the first node and the complement of the bit information at the second node, respectively.

14. The SRAM cell of claim 11, further comprising one or more additional word lines, one or more additional bit lines, and one or more additional complementary bit lines, wherein:
the one or more additional word lines and the one or more additional bit lines are connected to the first NOR gate; and
the one or more additional word lines and the one or more additional complementary bit lines are connected to the second NOR gate.

15. The SRAM cell of claim 1, further comprising:
a first gate connected to generate the first write operation signal based on one or more word lines and one or more bit lines; and
a second gate connected to generate the second write operation signal based on the one or more word lines and one or more complementary bit lines.

16. The SRAM cell of claim 15, wherein the first and second gates are NOR logic gates.

17. The SRAM cell of claim 15, wherein:
for each word line/bit line pair, the first gate comprises:
a first series pair of PMOS transistors (i) connected between the supply voltage and the first write operation signal and (ii) whose gates are respectively connected to the word line/bit line pair; and
a first parallel pair of NMOS transistors (i) connected between the first write operation signal and the ground voltage and (ii) whose gates are respectively connected to the word line/bit line pair; and
for each word line/complementary bit line pair, the second gate comprises:
a second series pair of PMOS transistors (i) connected between the supply voltage and the second write operation signal and (ii) whose gates are respectively connected to the word line/complementary bit line pair; and
a second parallel pair of NMOS transistors (i) connected between the second write operation signal and the ground voltage and (ii) whose gates are respectively connected to the word line/complementary bit line pair.

18. The SRAM cell of claim 17, wherein:
the first gate is connected to generate the first write operation signal based on two or more word lines and two or more bit lines;
the second gate is connected to generate the second write operation signal based on the two or more word lines and two or more complementary bit lines;
for the two or more word line/bit line pairs:
the two or more first series pairs of PMOS transistors are connected in parallel between the supply voltage and the first write operation signal; and
the two or more first parallel pairs of NMOS transistors are connected in series between the first write operation signal and the ground voltage; and
for the two or more word line/complementary bit line pairs:
the two or more second series pairs of PMOS transistors are connected in parallel between the supply voltage and the second write operation signal; and
the two or more second parallel pairs of NMOS transistors are connected in series between the second write operation signal and the ground voltage.

19. The SRAM cell of claim 6, wherein:
the first complex gate is connected to two or more word lines and two or more bit lines; and
the second complex gate is connected to the two or more word lines and two or more complementary bit lines.

* * * * *